United States Patent
Luning et al.

(10) Patent No.: US 6,506,642 B1
(45) Date of Patent: Jan. 14, 2003

(54) REMOVABLE SPACER TECHNIQUE

(75) Inventors: Scott D. Luning, Austin, TX (US); Jon D. Cheek, Round Rock, TX (US); Daniel Kadosh, Austin, TX (US); James F. Buller, Austin, TX (US); David E. Brown, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/020,931

(22) Filed: Dec. 19, 2001

(51) Int. Cl.$^7$ .......................................... H01L 21/8238
(52) U.S. Cl. ....................... 438/231; 438/275; 438/305; 438/592; 438/286
(58) Field of Search ................................ 438/231, 305, 438/585, 275, 286, 592

(56) References Cited

U.S. PATENT DOCUMENTS

| | | | | |
|---|---|---|---|---|
| 5,371,026 A | * | 12/1994 | Hayden et al. | 438/275 |
| 5,696,012 A | * | 12/1997 | Son | 438/231 |
| 5,789,780 A | * | 8/1998 | Fulford et al. | 257/339 |
| 5,846,857 A | * | 12/1998 | Ju | 257/336 |
| 5,943,565 A | * | 8/1999 | Ju | 428/231 |
| 6,103,563 A | * | 8/2000 | Lukanc et al. | 438/230 |
| 6,187,620 B1 | * | 2/2001 | Fulford et al. | 438/199 |

* cited by examiner

Primary Examiner—Richard Booth

(57) ABSTRACT

Submicron-dimensioned MOS and/or CMOS transistors are fabricated utilizing a simplified removable sidewall spacer technique, enabling effective tailoring of individual transistors to optimize their respective functionality. Embodiments include forming a first sidewall spacer having a first thickness on the side surfaces of a plurality of gate electrodes of transistors, selectively removing the first sidewall spacers from the gate electrodes of certain transistors, and then depositing second sidewall spacers on remaining first sidewall spacers and on the side surfaces of the gate electrodes from which the first sidewall spacers have been removed. Embodiments enable separately tailoring n- and p-MOS transistors as well as individual n- or p-MOS transistors having different functionality, e.g., different drive current and voltage leakage requirements.

19 Claims, 3 Drawing Sheets

REMOVABLE SPACER TECHNIQUE

FIELD OF THE INVENTION

The present invention relates to a method of manufacturing semiconductor devices with independently optimized transistor performance. The present invention has particular applicability in fabricating high density integration semiconductor devices with MOS-type transistors having a design rule of about 0.12 μm and below.

BACKGROUND OF THE INVENTION

As feature sizes of metal-oxide-semiconductor (MOS) and complementary metal-oxide-semiconductor (CMOS) devices are reduced into the deep sub-micron range, so-called "short-channel" effects arise which tend to limit device performance. Deep junctions, as provided in PMOS devices, and high on-resistance, are problematic for voltages less than 2V.

For p-channel MOS transistors of short-channel type, the major limitation on performance arises from "punch-through" effects which occur with relatively deep junctions. In such instances, there is a wider sub-surface depletion effect and it is easier for the field lines to go from the drain region to the source region, resulting in the above-mentioned "punch-through" current problems and device shorting. To minimize this effect, relatively shallow junctions are employed in forming p-channel MOS transistors.

The most satisfactory solution to date of hot carrier instability problems of MOS devices is the provision of shallow source/drain extensions driven just under the gate electrode region, while the heavily-doped drain region is laterally displaced away from the gate by use of a sidewall spacer on side surfaces of the gate electrode. Such structures are particularly advantageous in avoiding large lateral diffusion, and the channel length can be set precisely.

In order to reduce contact resistance and increase control speed, metal silicide layers are conventionally formed on source/drain regions. As device geometries continue to plunge into deep sub-micron range, the need to accurately control the thickness of sidewall spacers formed on side surfaces of gate electrodes becomes increasingly significant. For example, adverting to FIG. 1, a gate electrode 11 is formed over semiconductor substrate 10 with a gate dielectric layer 12 therebetween and the sidewall spacers 13 on sides surfaces thereof. Sidewall spacers 13 can comprise polycrystalline silicon, silicon oxide, a silicon nitride or a silicon oxynitride. Shallow source/drain extensions 14 are typically formed using the gate electrode as a mask before forming sidewall spacers 13.

Subsequently, as shown in FIG. 2, ion implantation is typically conducted using the gate electrode 11 and sidewall spacers 13 as a mask to form moderately- or heavily-doped and deeper source/drain regions 21. The thickness W of sidewall spacer 13 is significant in at least two respects. Initially, as shown in FIG. 2, the thickness W of sidewall spacer 13 controls the length of the shallow source/drain extension 14. In addition, as shown in FIG. 3, the width W of sidewall spacer 13 controls the distance between metal silicide layer 30 and side surfaces of gate electrode 11.

A semiconductor chip contains numerous transistors designed for different functionality. It is therefore, highly desirable to decouple the optimum characteristics of an n-channel transistor from a p-channel transistor, as well as decoupling performance of similarly doped n-type transistors or p-type transistors depending upon their function, such as maximizing drive current or optimizing short channel effects. In order to achieve optimum performance for individual transistors, whether or not they have the same or different conductivity type, it is necessary to selectively tailor the width of the sidewall spacers on the side surfaces of the gate electrodes of particular transistors. As device geometries shrink further into the deep sub-micron regime, the ability to optimize the functionality of the individual transistors becomes increasingly significant. Conventional processing techniques employing disposable spacers made of various materials, such as polysilicon, silicon oxides, silicon nitrides, silicon oxynitrides, and combinations thereof, have been implemented with varying degrees of success and efficiency.

There exists a continuing need for methodology enabling the fabrication of semiconductor devices comprising transistors, both MOS and CMOS transistors, which are individually tailored for optimum functionality in an efficient, simplified, cost effective manner fully compatible with conventional process flow and increasing manufacturing throughput and product yield.

DISCLOSURE OF THE INVENTION

An advantage of the present invention is an efficient method for fabricating a semiconductor device which enables optimizing the functionality of individual transistors.

Another advantage of the present invention is a method of fabricating a semiconductor device by tailoring the thickness of the sidewall spacers for individual transistors.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are achieved in part by a method of manufacturing a semiconductor device, the method comprising: forming first and second gate electrodes, each gate electrode having side surfaces, over first and second gate dielectric layers, respectively, over a substrate; forming a first sidewall spacer, having a first thickness, on the side surfaces of the first and second gate electrodes; selectively removing the first sidewall spacer from the side surfaces of the first gate electrode while leaving the first sidewall spacer on the side surfaces of the second gate electrode; and depositing a second sidewall spacer, having a second thickness, on the side surfaces of the first gate electrode and on the first sidewall spacers on the side surfaces of the second gate electrode.

Embodiments of the present invention comprise forming the first and second sidewall spacers from a dielectric material, such as a silicon oxide, a silicon nitride or a silicon oxynitride. Advantageously, the first and second sidewall spacers can be formed of the same dielectric material. Embodiments of the present invention include forming the first sidewall spacer at a thickness of about 600 Å to about 1,200 Å and forming the second sidewall spacer at a thickness of about 300 Å to about 900 Å, such that the total thickness of the first and second sidewall spacers is about 900 Å to about 1,500 Å. Advantageously, the selective removal technique of the present invention can be applied to CMOS transistors having difference conductivity type transistors, or to two transistors having the same conductivity type, to optimize their respective functionalities.

Embodiments of the present invention include removing the first sidewall spacer by etching, as by adjusting the etching conditions to achieve an anisotropic etching component and an isotropic etching component thereby, effectively removing the first sidewall spacer in an efficient manner without jeopardizing the integrity of the substrate surface. Etching can be effected using conventional etch recipes, such as a basic $SF_6$ etchant recipe. Etching can also be implemented using hot phosphoric acid.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are capable of modification in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 3 and in FIGS. 4 through 6, similar elements or features are denoted by similar reference characters.

DESCRIPTION OF THE INVENTION

Figure 1:
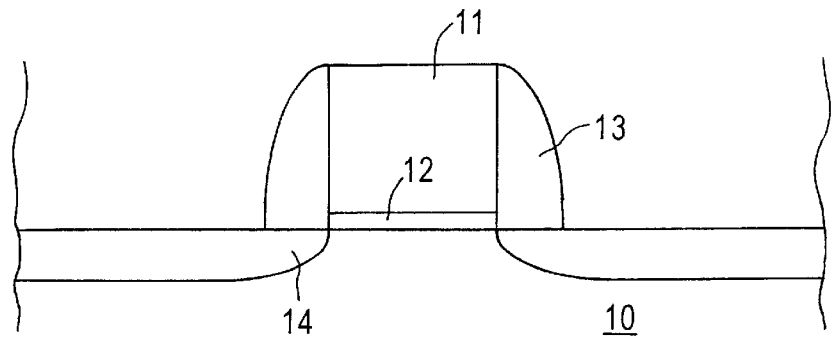
FIGS. 1 through 3 schematically illustrate the significance of the thickness of a sidewall spacer on the length of a shallow source/drain extension and separation of a metal silicide layer from the gate electrode.
Figure 2:
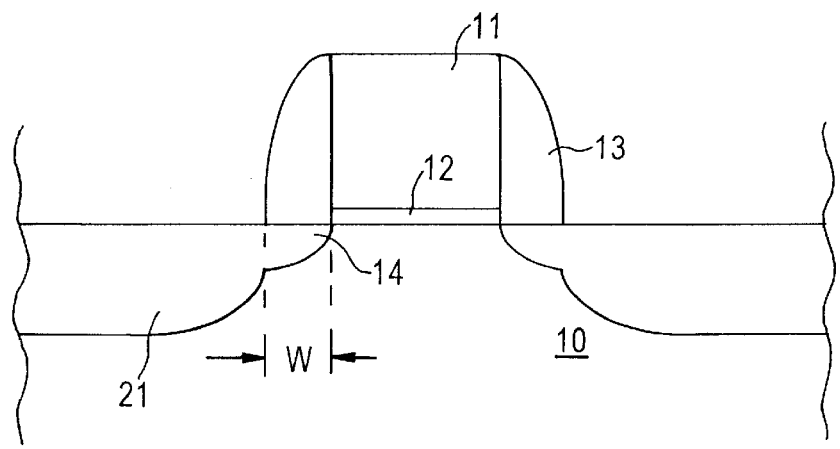
Figure 3:
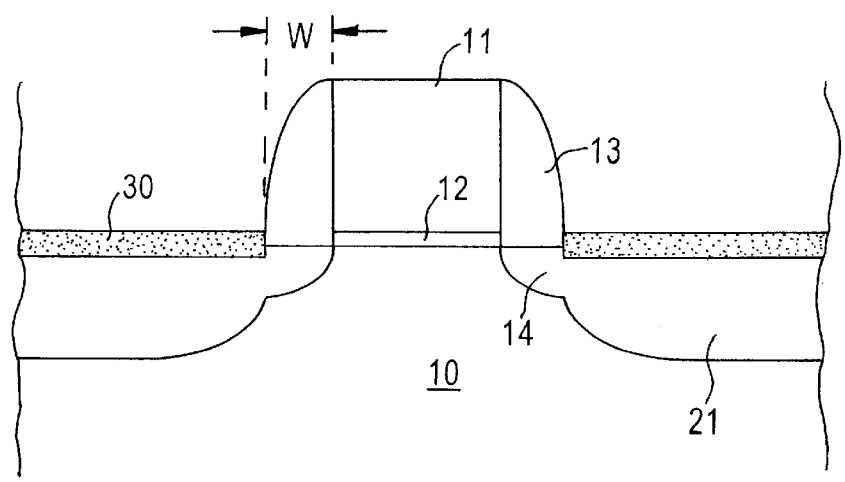

The present invention addresses the demands of continuing miniaturization for methodology enabling optimization of individual transistors on a chip. The present invention advantageously enables optimizing the functionality of various types of transistors, including n-MOS transistors vis-á-vis p-MOS transistors, as well as transistors having the same conductivity type, depending on functionality. Thus, the present invention enables decoupling the length of the shallow source/drain extension of n- and p-MOS transistors of a CMOS device, and decoupling the leakage current characteristics of transistors having similar or different conductivity types depending on the drive current required, for example, by tailoring the thickness of the sidewall spacers formed on individual gate electrodes.

In accordance with embodiments of the present invention, a first sidewall spacer is formed on the side surfaces of transistors on a semiconductor chip. The transistors are typically separated from the substrate by a gate oxide layer having a suitable thickness, such as about 10 to about 30 Å. The sidewall spacers are formed in a conventional manner, as by depositing a conformal layer of a silicon oxide, silicon nitride, or silicon oxynitride, and then anisotropically etching. The thickness of the sidewall spacer is a function of the thickness of the originally deposited layer. In embodiments of the present invention, the first sidewall spacer is formed at first suitable thickness, such as about 600 Å to about 1,200 Å.

Subsequently, the first sidewall spacer is selectively removed from particular transistors, e.g., transistors having gate electrodes on which sidewall spacers having a relatively smaller thickness are desired. The transistors having the gate electrodes on which it is desired to maintain the first sidewall spacers are masked, as by employing a photoresist mask. Selective removal of the first sidewall spacers can then be effected by wet etching, as by employing hot phosphoric acid, or by dry etching.

In an embodiment of the present invention, dry etching is conducted during which conditions are controlled to achieve an anisotropic etching component (vertical etching) and an isotropic etching component (lateral etching), for greater efficiency and reduced adverse impact on the substrate surface during etching. In accordance with an embodiment of the present invention, etching conditions are controlled, as by controlling the RF power, etchant, pressure and/or etchant ratios, to achieve a ratio of lateral etching to vertical etching of about 1:3 to about 1:1.

Embodiments of the present invention include conducting ion implantation, using the gate electrodes as a mask, to form shallow source/drain extensions. The first sidewall spacers are then formed followed by selective removal of the first sidewall spacers from certain transistors depending upon their functionality. The second sidewall spacers are then formed. The gate electrodes with sidewall spacers thereon are then employed as masks during ion implantation to form source/drain implants which are subsequently activated by annealing to form source/drain regions. Metal silicide layers, such as cobalt silicide, then formed on the exposed surfaces of the source/drain regions and on the upper surface the gate electrode. Advantageously, for individual transistors, the length of the source/drain extension and distance between the metal silicide layers and side surface of the gate electrode are tailored depending upon the particular functionality of the individual transistors in an efficient, cost effective manner.

Figure 4:
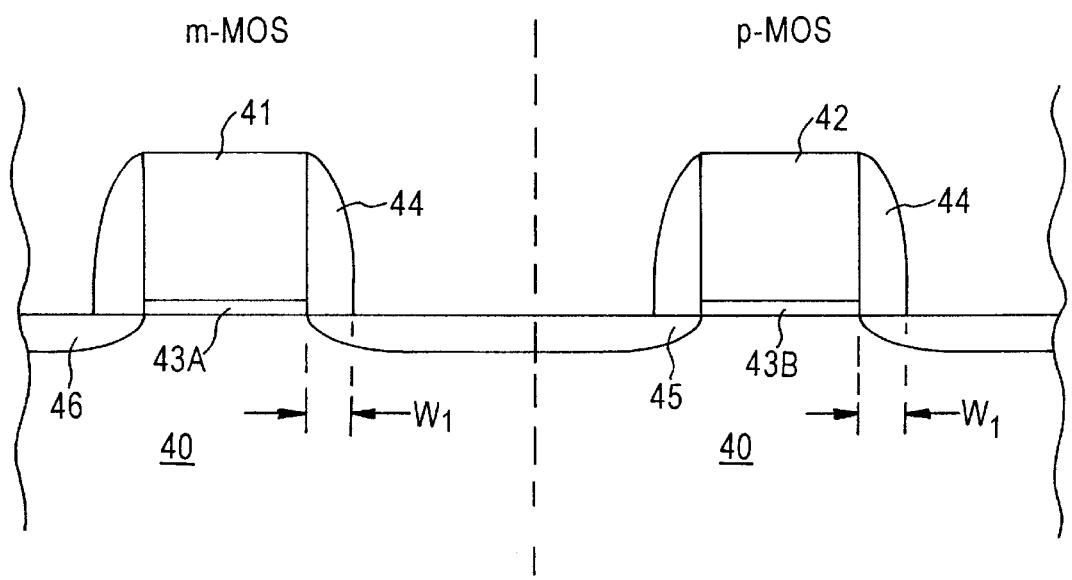
FIGS. 4 through 6 schematically illustrate sequential phases in accordance with an embodiment of the present invention.
Figure 5:
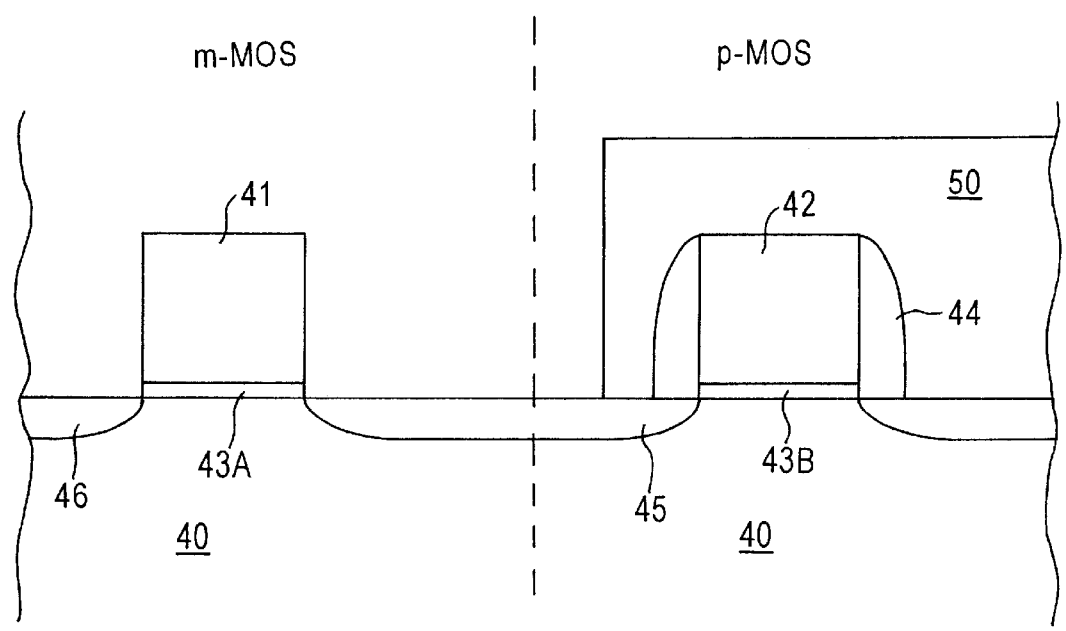
Figure 6:
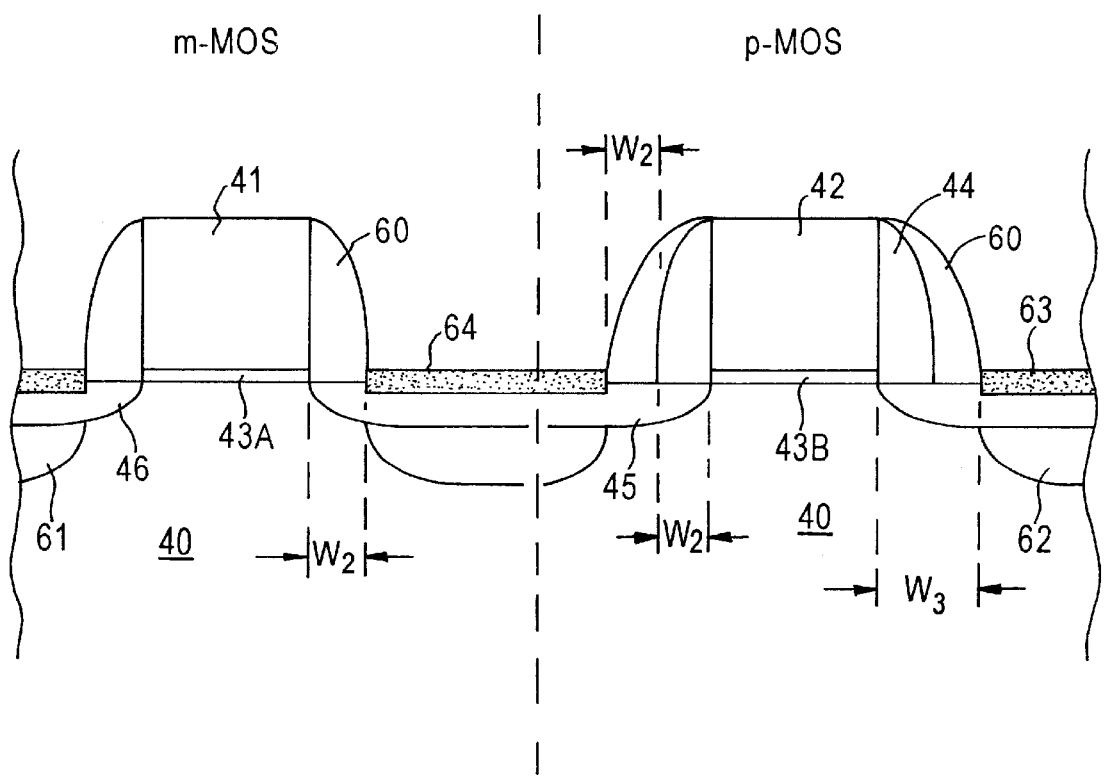

An embodiment of the present invention is schematically illustrated in FIGS. 4 through 6. Adverting to FIG. 4, first and second transistors, i.e. n-MOS and p-MOS transistors of a CMOS device, are formed, typically separated by a trench isolation containing a silicon oxide fill. First gate electrode 41 is formed over a semiconductor substrate 40 with first gate dielectric layer 43A therebetween in the n-MOS region, and second gate electrode 42 is formed over substrate 40 with second gate dielectric layer of 43B therebetween in the p-MOS region. Shallow source/drain extensions 45, 46 are then formed in a conventional manner employing gate electrodes 41 and 42 as masks. Subsequently, first sidewall spacer 44 is deposited on the side surfaces of the first and second gate electrodes 41, 42. Sidewall spacer 44 that has a width $W_1$ typically of about 600 to about 1,200 Å.

Subsequently, as schematically illustrated in FIG. 5, a photoresist mask 50 is formed over the second gate electrode 42, inclusive of the first sidewall spacers 44, and etching is conducted to remove the first sidewall spacers 44 from the side surfaces of the first gate electrode 41, as by dry or plasma etching while adjusting etching conditions to achieve both vertical and lateral etching components thereby improving efficiency and reducing substrate damage. Subsequently, as illustrated in FIG. 6, second sidewall spacer 60 is then deposited on the side surfaces of the first gate electrode 41 and on the first sidewall spacers 44 positioned on the side surfaces of second gate electrode 42. Second sidewall spacer 60 is deposited at a width $W_2$ typically about 300 Å to about 900 Å. It can be appreciated from FIG. 6 that the width of the second sidewall spacer $W_2$ selectively controls the length of the source/drain extension 46 of the n-MOS transistor, while the thickness of the first and second sidewall spacers $W_3$, typically about 900 Å to 1,500 Å, controls the length of the source/drain extension of p-MOS transistor. Further, the thickness of the second sidewall spacer $W_2$ controls the distance between the metal silicide layer 64 and side surfaces of gate electrode 41, while the combined thicknesses $W_3$ of the first and second sidewall spacers separate the side surfaces of gate electrode 42 from metal silicide layer 63.

Embodiments of the present invention enable tailoring the thickness of the sidewall spacer for individual transistors, thereby enabling optimization of the particular functionality of the individual transistors. It should be appreciated that although the embodiment illustrated in FIGS. 4 through 6 includes tailoring the thickness of the sidewall spacer for n-MOS and p-MOS transistors, the present invention is applicable to tailoring the thickness of sidewall spacers for transistors having the same conductivity type, such as separately tailoring the thickness of the sidewall spacers for two n-MOS transistors or two p-MOS transistors.

The present invention enables optimization of functionality for individual transistors in a cost effective efficient manner, utilizing existing fabrication facilities with improved efficiency, increased reliability and increased manufacturing throughput. The present invention is applicable to the fabrication of any of the various types of semiconductor devices, particularly semiconductor devices having increased density and a design rule of about 0.12 micron and under.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:
    forming first and second gate electrodes, each gate electrode having side surfaces, over first and second gate dielectric layers, respectively, over a substrate;
    forming a first sidewall spacer, having a first thickness, on the side surfaces of the first and second gate electrodes;
    selectively removing the first sidewall spacer from the side surfaces of the first gate electrode while leaving the first sidewall spacer on the side surfaces of the second gate electrode; and
    depositing a second sidewall spacer, having a second thickness, on the side surfaces of the first gate electrode and on the first sidewall spacer on the side surfaces of the second gate electrode.

2. The method according to claim 1, comprising forming the first and second sidewall spacers from a material selected from the group consisting of silicon nitrides and silicon oxynitrides.

3. The method according to claim 1, comprising forming the first sidewall spacer at a first thickness of about 600 Å to about 1200 Å.

4. The method according to claim 1, comprising forming the second sidewall spacer at a second thickness of about 300 Å to about 900 Å.

5. The method according to claim 1, comprising forming the first and second sidewall spacers such that the sum of the first thickness and second thickness is about 900 Å to about 1,500 Å.

6. The method according to claim 1, comprising removing the first sidewall spacer by dry etching.

7. The method according to claim 6, comprising adjusting etching conditions to effect an anisotropic etching component and an isotropic etching component.

8. The method according to claim 7, comprising controlling etching conditions such that the ratio of the degree of lateral etching to the degree of vertical etching is about 1:3 to about 1:1.

9. The method according to claim 1, wherein the first gate electrode is part of a n-MOS transistor and the second gate electrode is part of p-MOS transistor.

10. The method according to claim 1, wherein the first and second gate electrodes are each part of different transistors having the same conductivity type.

11. The method according to claim 1, comprising sequentially:
    forming the first and second gate electrodes;
    ion implanting, using the first and second gate electrodes as a mask, to form shallow source/drain extensions;
    forming the first sidewall spacer on the side surfaces of the first and second gate electrode;
    removing the first sidewall spacer from the side surfaces of the first gate electrode;
    forming the second sidewall spacer;
    ion implanting, using the first and second gate electrodes and sidewall spacers thereon as a mask to form source/drain regions; and
    forming first and second silicide regions on the source/drain regions, the first silicide regions being spaced apart from the side surfaces of the first gate electrode by the second thickness, and the second silicide regions being spaced apart from the side surfaces of the second gate electrode by the first and second thicknesses.

12. The method according to claim 11, wherein the first gate electrode is part of an n-MOS transistor and the second gate electrode is part of a p-MOS transistor, the method comprising:
    masking the second gate electrode when ion implanting to form the shallow source/drain extensions of the n-MOS transistor;
    masking the first gate electrode when forming the shallow source/drain extensions for the p-MOS transistor;
    masking the second gate electrode when forming the source/drain regions for the n-MOS transistor; and
    masking the first gate electrode when forming the source/drain regions for the p-MOS transistor.

13. The method according to claim 11, comprising masking the second gate electrode and first sidewall spacer on the side surfaces thereof when removing the first sidewall spacer from the side surfaces of the first gate electrode.

14. The method according to claim 12, comprising:
    forming the first sidewall spacer at a first thickness of about 600 Å to about 1,200 Å; and forming the second sidewall spacer at the second thickness of about 300 Å to about 900 Å, wherein the sum of the first thickness and second thickness is about 900 Å to about Å 1,500.

15. The method according to claim 12, wherein the first and second sidewall spacers are formed of a dielectric material.

16. The method according to claim 15, wherein the first and second sidewall spacers are formed of the same dielectric material.

17. The method according to claim 12, comprising removing the first sidewall spacers from the side surfaces of the gate electrode by etching.

18. The method according to claim 17, comprising adjusting etching conditions to effect an anisotropic etching component and an isotropic etching component.

19. The method according to claim 18, controlling etching conditions such that the ratio of the degree of lateral etching to the degree of vertical etching is about 1:3 to about 1:1.

* * * * *